(12) United States Patent
Lee

(10) Patent No.: US 8,736,139 B2
(45) Date of Patent: May 27, 2014

(54) OPTICAL IMAGE STABILIZER AND METHOD OF MANUFACTURING THE SAME

(75) Inventor: Seung Seoup Lee, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 183 days.

(21) Appl. No.: 12/926,648

(22) Filed: Dec. 1, 2010

(65) Prior Publication Data

US 2011/0299842 A1   Dec. 8, 2011

(30) Foreign Application Priority Data

Jun. 4, 2010 (KR) .................. 10-2010-0052789

(51) Int. Cl.
*H02N 1/00* (2006.01)

(52) U.S. Cl.
CPC .............. *H02N 1/008* (2013.01); *H02N 1/006* (2013.01)
USPC ................. 310/309; 216/13; 396/55; 374/1; 374/179

(58) Field of Classification Search
CPC ............................ H02N 1/006; H02N 1/008
USPC ............ 310/309; 216/13; 374/1, 179; 396/55
See application file for complete search history.

(56) References Cited

U.S. PATENT DOCUMENTS

| | | | | |
|---|---|---|---|---|
| 4,954,789 A | * | 9/1990 | Sampsell | 359/318 |
| 5,629,794 A | * | 5/1997 | Magel et al. | 359/290 |
| 7,215,061 B2 | * | 5/2007 | Kihara et al. | 310/309 |
| 7,550,726 B2 | * | 6/2009 | Ikushima et al. | 250/338.1 |
| 7,742,016 B2 | * | 6/2010 | Hagood et al. | 345/55 |
| 7,773,119 B2 | * | 8/2010 | Wada et al. | 348/208.99 |
| 2002/0086458 A1 | * | 7/2002 | Liu et al. | 438/64 |
| 2003/0057802 A1 | * | 3/2003 | Koga et al. | 310/309 |
| 2005/0146241 A1 | * | 7/2005 | Wan | 310/309 |
| 2007/0076098 A1 | | 4/2007 | Yasuda et al. | |
| 2007/0279497 A1 | * | 12/2007 | Wada et al. | 348/208.7 |
| 2007/0285558 A1 | * | 12/2007 | Oohara et al. | 348/345 |
| 2008/0204909 A1 | * | 8/2008 | Shiota et al. | 359/824 |
| 2009/0189482 A1 | * | 7/2009 | Shibata et al. | 310/311 |
| 2011/0299842 A1 | * | 12/2011 | Lee | 396/55 |

FOREIGN PATENT DOCUMENTS

| | | |
|---|---|---|
| JP | 10-39356 | 2/1998 |
| JP | 2008-177972 | 7/2008 |
| JP | 2008-209682 | 9/2008 |
| JP | 2008-225158 | 9/2008 |
| KR | 10-2006-0093464 | 8/2006 |
| KR | 10-2009-0035422 | 4/2009 |

OTHER PUBLICATIONS

Korean Office Action issued Jan. 30, 2012 in corresponding Korean Patent Application No. 10-2010-0052789.
Korean Notice of Allowance issued May 15, 2012 in corresponding Korean Patent Application No. 10-2010-0052789.

* cited by examiner

*Primary Examiner* — John K Kim

(57) ABSTRACT

Disclosed herein is an optical image stabilizer, including: a substrate; a table disposed over the substrate, while levitating, to be movable on the substrate and having an image sensor mounted on the upper end of the substrate; cantilever arms disposed over the substrate, while levitating, and connected to the table to move the table; anchors fixing one ends of the cantilever arms onto the substrate; and electrodes applying voltage for moving the cantilever arm.

10 Claims, 5 Drawing Sheets

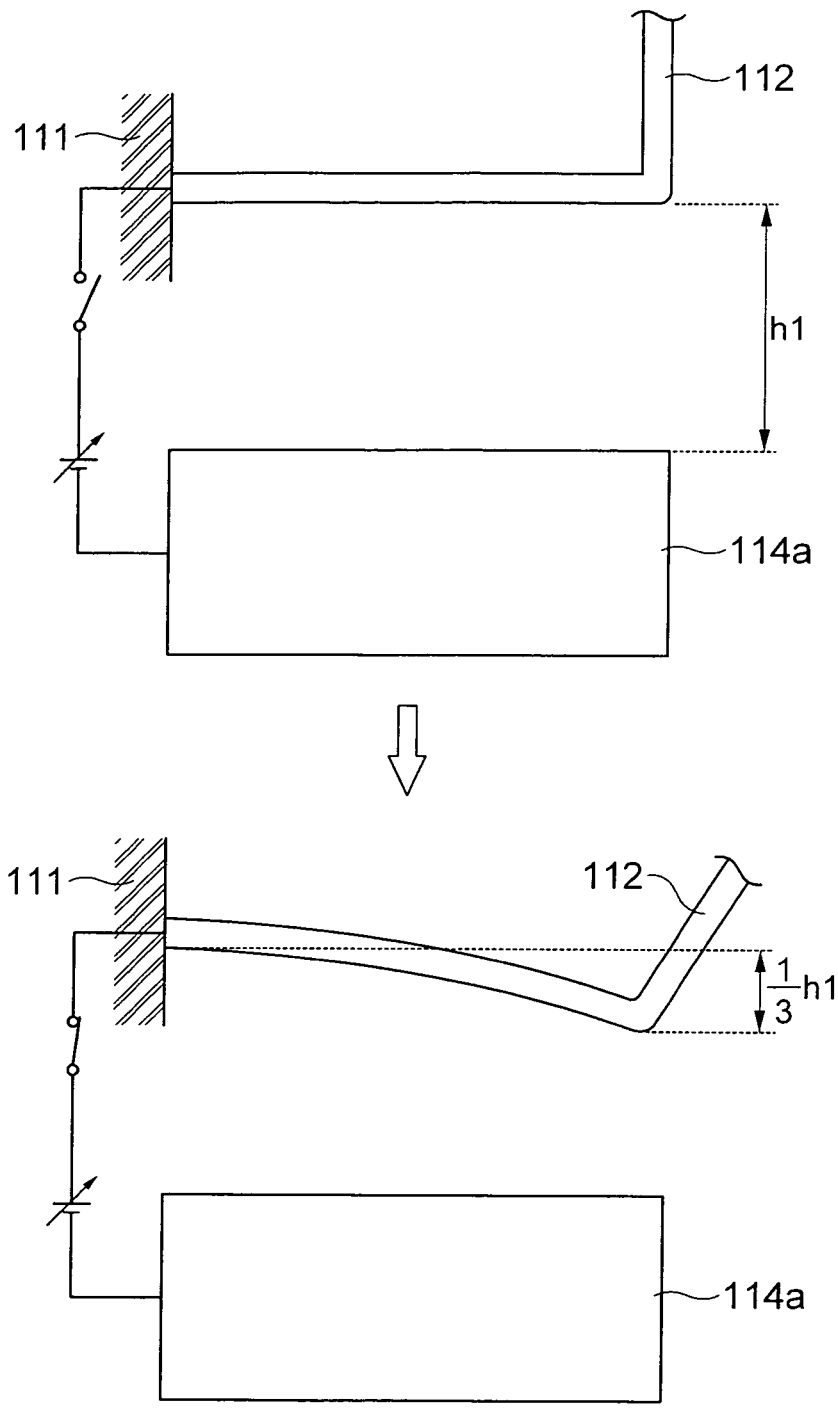

OPTICAL IMAGE STABILIZER AND METHOD OF MANUFACTURING THE SAME

CROSS REFERENCE(S) TO RELATED APPLICATIONS

This application claims the benefit under 35 U.S.C. Section [120, 119, 119(e)] of Korean patent application Serial No. 10-2010-0052789, entitled "Optical Image Stabilizer And Method Of Manufacturing The Same", filed on Jun. 4, 2010, which is hereby incorporated by reference in its entirety into this application

BACKGROUND OF THE INVENTION

1. Technical Field

The present invention relates to an optical image stabilizer, and more particularly, to an optical image stabilizer that drives an image sensor and a method of manufacturing the same.

2. Description of the Related Art

Recently, a camera apparatus has been commonly adopted to a mobile communication terminal. Taking a photograph using a mobile communication terminal is frequently made while in motion. Therefore, in order to obtain a high quality image, it is indispensably requested for the camera apparatus of the mobile communication terminal to have an image stabilizer that compensates for vibration such as hand shaking or the like.

In particular, the camera apparatus has the image stabilizer, thereby making it possible to obtain a high-definition image in the environment in which shutter speed is slow due to lack of light such as a dark room or at night.

An optical image stabilizer (OIS) among image stabilizers changes the position of an optical lens or an image sensor, such that it serves to compensate for an image of a subject formed on the image sensor not to be shaken even though a photographing apparatus is shaking.

In this configuration, the image stabilizer moving the optical lens needs a space large enough to have a driver driving the optical lens therein, such that it has a limitation in adopting a mobile communication terminal having a large spatial imitation. In contrast, the optical image stabilizer moving the image sensor needs a smaller installation space as compared to the image stabilizer moving the optical lens.

Therefore, various technologies developing an image stabilizer moving the image sensor have been developed in order to be adopted for the mobile communication terminal. However, there have been lots of difficulties in satisfying a limitation in driving displacement of the image sensor and a spatial limitation.

SUMMARY OF THE INVENTION

The present invention has been proposed to solve the problems that may be generated from a camera apparatus. More specifically, an object of the present invention is to provide an optical image stabilizer that can compensate for an image due to a hand shaking by driving an image sensor, and a method of manufacturing the same.

According to an exemplary embodiment of the present invention, there is provided an optical image stabilizer. The optical image stabilizer includes: a substrate; a table disposed over the substrate, while levitating, to be movable on the substrate and having an image sensor mounted on the upper end of the substrate; cantilever arms disposed over the substrate, while levitating, and connected to the table to move the table; anchors fixing one ends of the cantilever arms onto the substrate; and electrodes applying voltage for moving the cantilever arms.

In this configuration, the electrode may have a curved surface, while being opposite to the cantilever arm.

In addition, the electrode may include first and second electrodes corresponding to one side surface of the table and having a bilaterally symmetrical structure.

In addition, the cantilever arms may each be disposed on two side surfaces based on the edge of the table.

In addition, the one ends of the cantilever arms each disposed on two side surfaces of the table may be connected to one anchor disposed on the substrate corresponding to the edge of the table.

In addition, the cantilever arms may be formed to be integral with the table.

In addition, the cantilever arm may be made of silicon.

In addition, the table may be made of silicon.

In addition, an insulator pattern may be further provided between the anchor and the substrate.

In addition, the optical image stabilizer may further include stoppers disposed over the substrate corresponding to each edge of the table and limiting the movable region of the table.

In addition, an insulator pattern may further be provided between the stopper and the substrate.

According to another exemplary embodiment of the present invention, there is provided a method of manufacturing an optical image stabilizer. The method of manufacturing an optical image stabilizer may include: providing an SOI substrate that includes first and second silicon each provided on the upper surface and the lower surface of the substrate, having an insulator layer therebetween; forming a table, a cantilever arm connected to the table, an anchor connected to the cantilever arm, and an electrode opposite to the cantilever arm by etching the first silicon; allowing the table and the cantilever arm to levitate from the second silicon by removing an insulator layer disposed under the table and the cantilever arm; and mounting an image sensor on the table.

In this configuration, the electrode may have a curved surface, while being opposite to the cantilever arm.

In addition, the forming the table, the cantilever arm connected to the table, the anchor connected to the cantilever arm, and the electrode opposite to the cantilever arm by etching the first silicon may further include forming stoppers disposed on the second silicon corresponding to each edge of the table and limiting the movable region of the table.

BRIEF DESCRIPTION OF THE DRAWINGS

FIGS. 3A and 3B are schematic diagrams showing a portion corresponding to region A of FIG. 1.

DESCRIPTION OF THE PREFERRED EMBODIMENTS

Figure 1:
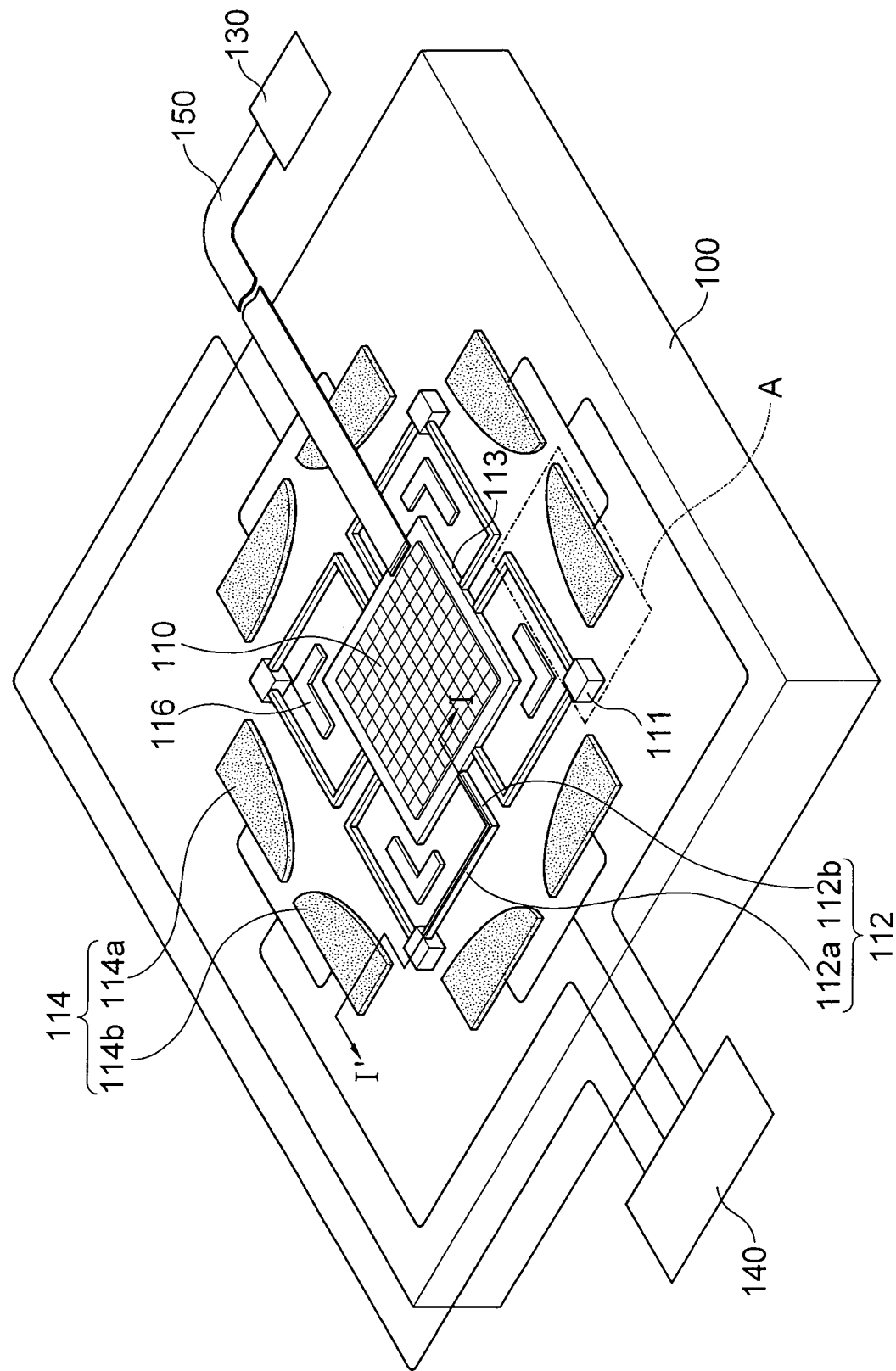
FIG. 1 is a perspective view of an optical image stabilizer according to an embodiment of the present invention.

Hereinafter, exemplary embodiments of the present invention will be described in detail with reference to the drawings of an optical image stabilizer. The exemplary embodiments of the present invention to be described below are provided by way of example so that the idea of the present invention can be sufficiently transferred to those skilled in the art to which the present invention pertains. Therefore, the present invention may be modified in many different forms and it should not be limited to the embodiments set forth herein. In the drawings, the size and the thickness of the apparatus may be exaggerated for convenience. Like reference numerals denote like elements throughout the specification.

FIG. 1 is a perspective view of an optical image stabilizer according to an embodiment of the present invention.

Figure 2:
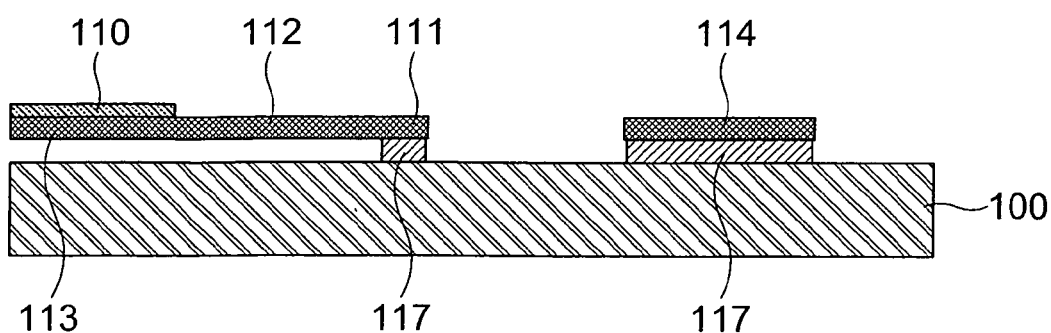
FIG. 2 is a cross-sectional view taken along line I-I' of FIG. 1.

FIG. 2 is a cross-sectional view taken along line I-I' of FIG. 1.

Referring to FIGS. 1 and 2, an optical image stabilizer according to an embodiment of the present invention may be configured of a MEMS structure so as to be miniaturized.

More specifically, the optical image stabilizer may include a table 113 on which an image sensor 110 is mounted. The table 113 may be disposed over a substrate 100, while levitating. In this configuration, the image sensor 110 may also move over the substrate 100 due to the movement of the table 113.

In this case, the image sensor 110, which is a device that converts image information into an electrical signal, may be formed of a CCD or a CMOS, but it is not limited thereto in the embodiment of the present invention. At this time, the image sensor 110 may be electrically connected to a signal processing unit 130 through a flexible printed circuit board 150 rather than a rigid printed circuit board so as to minimize the effect on the movement.

The substrate 100 may be a wafer substrate. In other words, the substrate 100 may be made of silicon.

Cantilever arms 112 connected to the table 113 may be disposed over the substrate 100, while levitating, so as to move the table 113. In this configuration, the cantilever arm 112 may be formed by etching silicon of silicon-on-insulator (SOI), together with the table 113. Therefore, the cantilever arms 112 may be formed to be integral with the table 113.

The cantilever arm 112 is connected to one end of an anchor 111 fixed on the substrate 100 and may include a first region 112a opposite to one surface of the table 113 and a second region 112b bent from the first region 112a to be connected to the table 113. At this time, the distal end of the first region 112a of the cantilever arm 112 moves to an electrode 114 to be described below by electrostatic gravity, and the second region 112b and the table 113 may also move to the electrode 114 by the movement of the first region 112a. In other words, the cantilever arms 112 move to the electrode 114, thereby making it possible to move the table 113.

The cantilever arms 112 are connected to all of the side surfaces of the table 113, respectively, thereby making it possible to move the table 113 horizontally and vertically. In this configuration, two cantilever arms 112 may also be connected to each of the side surfaces of the table 113. Therefore, the table 113 may sufficiently move with the movement of the cantilever arms 112. The movement distance of the table 113 may also be controlled by driving only one of the two cantilever arms 112 connected to one side surface of the table 113.

In this configuration, the anchors 111 are disposed at each edge of the table 113, wherein two cantilever arms 112 may be connected to one anchor 111. In this case, the two cantilever arms 112 connected to one anchor 111 may be connected to two side surfaces of the anchor 111 based on the edge of the table 113, respectively. Therefore, the number of anchors 111 may be formed by the half of the number of cantilever arms 112, thereby making it possible to prevent the size of the optical image stabilizer from being increased.

The anchor 111 fixed onto the substrate 100 is connected to one end of the cantilever arm 112, thereby serving to fix the cantilever arm 112 onto the substrate 100. In addition, the anchor 111 is connected to the table 113 through the cantilever arm 112, thereby further serving to fix the table 113 onto the substrate 100. In this case, the anchor 111 may be formed by etching silicon of silicon-on-insulator (SOI). At this time, an insulator layer of the silicon-on-insulator (SOI) disposed under the anchor 111 is also etched, such that an insulator pattern 117 may be disposed between the anchor 111 and the substrate 100. In this configuration, the insulator layer may be a silicon oxide or a silicon nitride by way of example. Therefore, the anchor 111 may be fixed onto the substrate 100 by the insulator pattern 117 interposed between the anchor 111 and the substrate 100.

In addition, stoppers 116 may be disposed on the substrate 100 corresponding to each edge of the table 113. The stopper 116 may serve to limit the movable range of the table. Therefore, it is possible to prevent the image sensor 110 from being escaped from an estimated range. Although not shown in the figure, the insulator pattern 117 is further disposed between the stopper 116 and the substrate 100, such that the stopper 116 may be fixed onto the substrate 100.

Electrodes 114 controlling the movement of the cantilever arms 112 may be disposed on the substrate 100, while facing the cantilever arms 112. The electrodes 114 may be fixed onto the substrate 100. When a constant voltage is applied to the electrodes 114, an electrostatic bias may be generated between the cantilever arms 112 and the electrodes 114. At this time, the cantilever arms 112 levitating over the substrate 100 by the electrostatic bias may move to the electrodes 114. In this configuration, when voltage is not applied to the electrodes 114, the cantilever arms 112 may be returned to their original positions by elastic restoring force. Herein, the insulator pattern 117, for example, silicon oxide or silicon nitride, may be disposed between the electrode 114 and the substrate 100. In this case, the electrode 114 is made of silicon, metal or a conductive material and the material of the electrode 114 is not limited in the embodiment of the present invention.

Meanwhile, the driving displacement of the cantilever arm 112 may be controlled by changing the shape of the electrode 114.

Hereinafter, the change in the driving displacement of the cantilever arm provided in the optical image stabilizer according to the shape of the electrode will be described in detail with reference to FIGS. 3A and 3B.

Figure 3B:
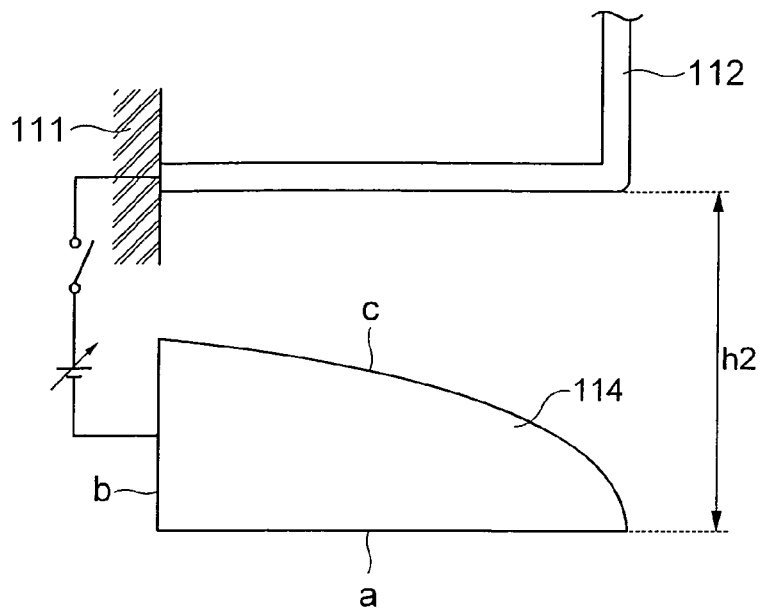
Figure 3B:
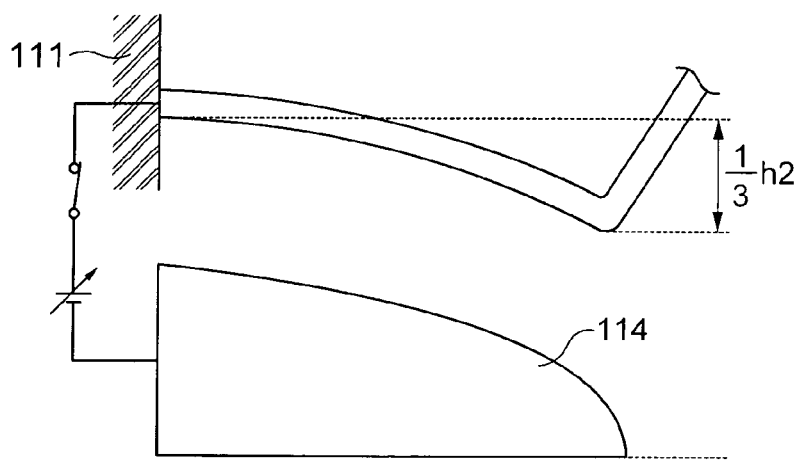

FIGS. 3A and 3B are schematic diagrams showing a portion corresponding to region A of FIG. 1. In this case, FIG. 3A is a schematic diagram showing the driving displacement of the cantilever arm in a horizontal electrode having a horizontal surface opposite to the cantilever arm, and FIG. 3B is a schematic diagram showing the driving displacement of the cantilever arm in a curved electrode opposite to the cantilever arm.

As shown in FIG. 3A, when the driving voltage is slowly applied to the horizontal electrode 114a, one end of the cantilever arm 112 moves to the horizontal electrode 114a. When the distance h1 between one end of the cantilever arm 112 and the horizontal electrode 114a exceeds by ⅓ or more, the cantilever arm 112 is instantly attracted to the horizontal electrode 114a. This is a pull-in phenomenon generated when the horizontal electrode 114a is electrostatically driven. This is generated at a point when the distance h1 between the horizontal electrode 114a and the cantilever arm 112 that is a driven body becomes ⅓. In other words, when the distance between the cantilever arm 112 and the horizontal electrode 114a is ⅓ or more, it is impossible to control the driving of the cantilever arm 112. Therefore, the movable displacement of the driven body may be generally limited to ⅓ h1 or less.

In order to expand the limitation of the movable displacement as described above, an electrode may be formed as a curved electrode 114 having a curved surface c, while being opposite to the cantilever arm 112, as shown in FIG. 3B. For example, the curved electrode 114 may have first and second straight line portions a and b perpendicularly connected to each other, and the curved surface c smoothly connecting distal ends of the first and second straight line portions a and b.

In this configuration, as the curved electrode 114 has the curved surface c, the distance h2 between the electrode 114 and the distal end of the cantilever arm 112 can be increased as compared to the case of the horizontal electrode 114a, such that a point where the distance between the cantilever arm 112 and the electrode 114 becomes ⅓ can be increased. In other words, the distance ⅓h2 of the driving displacement controllable in the curved electrode 114 can be increased as compared to the distance ⅓h1 of the driving displacement controllable in the horizontal electrode 114a. Therefore, the shape of the electrode 114 is changed to have a curved surface, thereby making it possible to easily increase the driving displacement of the cantilever arm 112.

Referring back to FIG. 1, the electrode 114 may include first and second electrodes 114a and 114b having a bilaterally symmetrical structure on one surface of the table 113. The reason is that at least two cantilever arms 112 are disposed on one surface of the table 113.

In addition, the electrode 114 is electrically connected to a driving circuit unit 140, thereby making it possible to drive the cantilever arm 112 by the signal applied from the driving circuit unit 140.

Therefore, the optical image stabilizer according to the present invention changes the shape of the electrode corresponding to the cantilever arm, that is, forms a curved electrode, thereby making it possible to implement a large displacement driving.

In addition, when the optical image stabilizer according to the present invention forms the electrode to have a curved surface shape, it can reduce the entire area of the electrode, thereby making it possible to lower manufacturing cost.

In the embodiment of the present invention, the optical image stabilizer can be manufacture using MEMS technology. As a result, it is possible to reduce the space area, where the optical image stabilizer is mounted in a camera apparatus, in a micro unit. Further, the optical image stabilizer can be mass-produced, thereby lowering price of modules.

FIGS. 4 to 7 are process diagrams for explaining a method of manufacturing an optical image stabilizer according to a second embodiment of the present invention.

Figure 4:
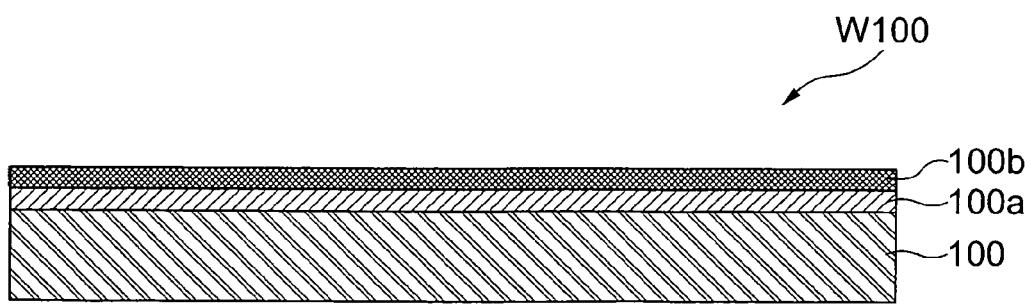
FIGS. 4 to 7 are process diagrams for explaining a method of manufacturing an optical image stabilizer according to a second embodiment of the present invention.

Referring to FIG. 4, in order to manufacture an optical image stabilizer, first, silicon-on-insulator (SOI) substrate W100 is provided. The SOI substrate W100 may be a wafer substrate. The SOI substrate W100 may include first and second silicon 100b and 100 provided on the upper surface and the lower surface of the substrate, respectively, having an insulator layer 100a therebetween.

In this configuration, the second silicon 100 may function as a substrate that supports the optical image stabilizer.

The insulator layer 100a may be a silicon oxide or a silicon nitride by way of example.

Figure 5:
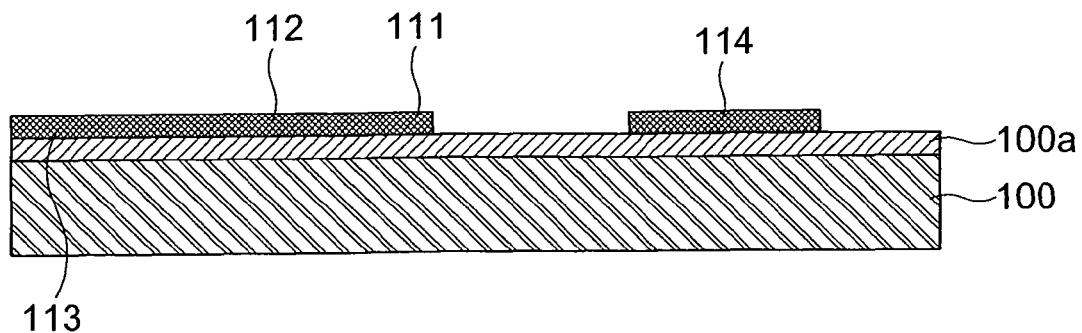

Referring to FIG. 5, a table 113, a cantilever arm 112 connected to the table 113, an anchor 111 connected to the cantilever arm 112, and an electrode 114 opposite to the cantilever arm 112 can be manufactured by etching the first silicon 100b. More specifically, in order to manufacture the table 113, the cantilever arm 112, and the anchor 111, a photoresist pattern is first formed on the first silicon 100b and then the first silicon 100b is etched using the photoresist pattern as an etching mask.

In this configuration, the electrode 114 may have a curved surface shape, while being opposite to the cantilever arm 112. Therefore, the movable displacement of the cantilever arm 112 can be increased.

In addition, while forming the table 113, stoppers 116 (in FIG. 1) that are disposed over the second silicon 100 corresponding to each edge of the table 113 and limiting the movable region of the table 113 may further be formed.

The embodiment of the present invention describes the case in which the electrode is made of the first silicon 100b, but the present invention is not limited thereto. For example, the insulator layer 100a is exposed by removing the first silicon 100b corresponding to the region where the electrode 114 is formed and then the electrode 114 made of metal or a conductive material may be formed on the insulator layer 100a exposed by the first silicon 100b. At this time, the electrode 114 may be formed by forming a paste with the metal or the conductive material and then printing the paste through a printing ink-jet method or the like. However, the embodiment of the present invention does not limit the method of forming the electrode 114 thereto. For example, the electrode 114 may also be formed through a deposition method and a photolithography method.

Figure 6:
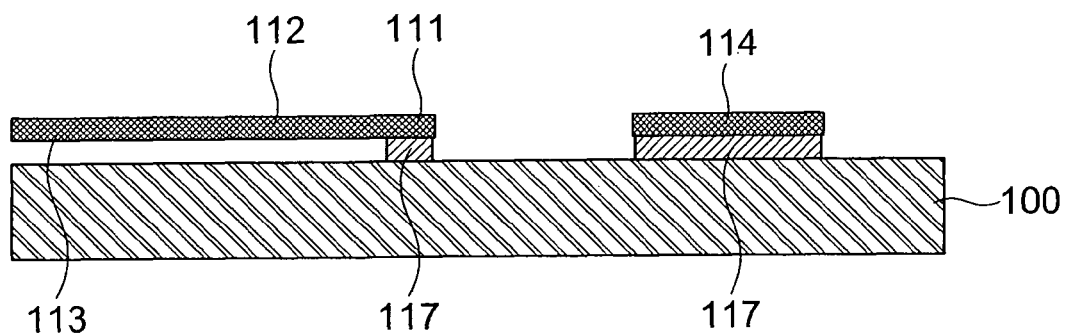

Referring to FIG. 6, the table 113 and the cantilever arm 112 may levitate from the second silicon 100 by removing the insulator layer 100a disposed under the table 113 and the cantilever arm 112. More specifically, after forming a protective layer that protects the anchor 111 and the electrode 114, the protective layer may be removed after etching the insulator layer 100a disposed under the table 113 and the cantilever arm 112. Herein, the protective layer may be made of a photoresist. Therefore, only the insulator layer 100a disposed under the table 113 and the cantilever arm 112 may be removed and the insulator patterns 117 may be interposed between the second silicon 100 and the and the anchor 111, and between the second silicon 100 and the electrode 114, respectively. In addition, although not shown in the figure, the insulator pattern 117 may further be interposed between the stopper 116 and the second silicon 100.

Figure 7:
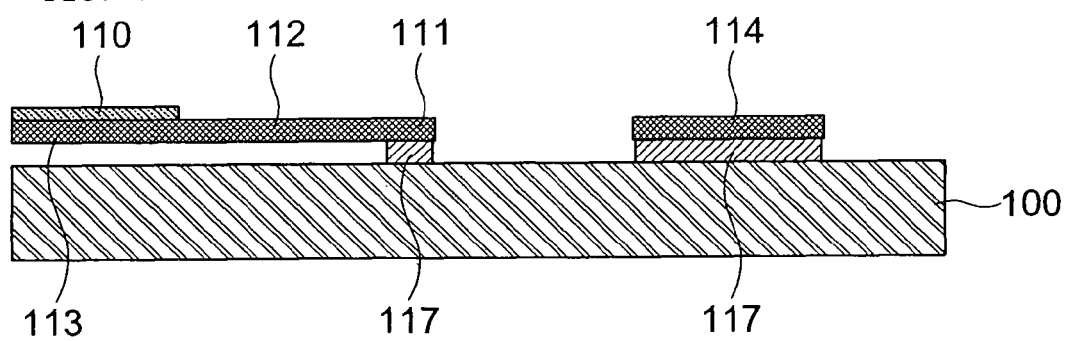

Referring to FIG. 7, an image sensor 110 is mounted on the table 113. In this configuration, the image sensor 110 may be mounted on the table 113 by a wire bonding method or a flip chip bonding method. Thereafter, the image sensor 110 and the signal processing unit 130 (in FIG. 1) may be electrically connected to each other through the flexible printed circuit board 150 (in FIG. 1).

Therefore, in the embodiment of the present invention, the optical image stabilizer can be manufactured using MEMS technology. As a result, it is possible to reduce the space area, which can mount the optical image stabilizer in a camera apparatus, in a micro unit. Further, the optical image stabilizer can be mass-produced, thereby lowering the price of modules.

The optical image stabilizer according to the present invention changes the shape of the electrode corresponding to the cantilever arm, thereby making it possible to implement a large displacement driving.

In addition, the optical image stabilizer according to the present invention can be manufactured using MEMS technology. As a result, it is possible to reduce the space area, which can mount the optical image stabilizer in a camera apparatus, in a micro unit. Further, the optical image stabilizer can be mass-produced, thereby lowering the price of modules.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

Accordingly, the scope of the present invention is not construed as being limited to the described embodiments but is defined by the appended claims as well as equivalents thereto.

What is claimed is:

1. An optical image stabilizer, comprising:
    a substrate;
    a table disposed above the substrate, while levitating, to be movable above the substrate and having an image sensor mounted on the table;
    one or more cantilever arms disposed above the substrate, while levitating, and connected to the table to horizontally move the table;
    one or more anchors fixing one ends of the one or more cantilever arms to the substrate; and
    one or more electrodes applying voltage to the respective one or more cantilever arms for horizontally moving the respective one or more cantilever arms without being in contact with the respective one or more cantilever arms and the table, wherein each electrode has a continuously curved surface facing a respective cantilever arm such that a distance between the electrode and the respective cantilever arm is larger at an end of the respective cantilever arm other than the one end fixed to the anchor.

2. The optical image stabilizer according to claim 1, wherein the one or more electrodes include at least one pair of first and second electrodes corresponding to one side surface of the table and having a bilaterally symmetrical structure.

3. The optical image stabilizer according to claim 1, wherein the cantilever arms are each disposed on two side surfaces based on an edge of the table.

4. The optical image stabilizer according to claim 3, wherein the one ends of the cantilever arms each disposed on two side surfaces of the table are connected to one anchor disposed on the substrate corresponding to the edge of the table.

5. The optical image stabilizer according to claim 1, wherein the one or more cantilever arms are formed to be integral with the table.

6. The optical image stabilizer according to claim 1, wherein the one or more cantilever arms are made of silicon.

7. The optical image stabilizer according to claim 1, wherein the table is made of silicon.

8. The optical image stabilizer according to claim 1, wherein an insulator pattern is further provided between the one or more anchors and the substrate.

9. The optical image stabilizer according to claim 1, further comprising stoppers disposed over the substrate corresponding to each edge of the table and limiting the movable region of the table.

10. The optical image stabilizer according to claim 9, wherein an insulator pattern is further provided between the stoppers and the substrate.

* * * * *